United States Patent
Wang et al.

(10) Patent No.: US 10,296,075 B2
(45) Date of Patent: May 21, 2019

(54) WIDE VOLTAGE RANGE LEVEL SHIFTING CIRCUIT WITH ISOLATION FUNCTION

(71) Applicant: Apple Inc., Cupertino, CA (US)

(72) Inventors: Zhao Wang, San Jose, CA (US); Miles G. Canada, Saratoga, CA (US)

(73) Assignee: Apple Inc., Cupertino, CA (US)

(*) Notice: Subject to any disclaimer, the term of this patent is extended or adjusted under 35 U.S.C. 154(b) by 153 days.

(21) Appl. No.: 15/151,665

(22) Filed: May 11, 2016

(65) Prior Publication Data

US 2017/0331463 A1 Nov. 16, 2017

(51) Int. Cl.
*G06F 1/32* (2019.01)
*G06F 1/3296* (2019.01)
*H03K 19/0185* (2006.01)
*H03K 3/356* (2006.01)
*G06F 1/26* (2006.01)

(52) U.S. Cl.
CPC ............. *G06F 1/3296* (2013.01); *G06F 1/26* (2013.01); *H03K 3/35613* (2013.01); *H03K 19/018521* (2013.01)

(58) Field of Classification Search
CPC ..................................................... G06F 1/3234
See application file for complete search history.

(56) References Cited

U.S. PATENT DOCUMENTS

| 5,332,932 A | * | 7/1994 | Runaldue | H03K 19/00361 |
| | | | | 326/33 |
| 8,791,743 B1 | * | 7/2014 | Tang | H03K 3/356104 |
| | | | | 326/80 |
| 9,263,949 B2 | | 2/2016 | Tsukuda | |
| 2014/0269112 A1 | | 9/2014 | Jung | |
| 2015/0280714 A1 | | 10/2015 | Kumar | |

* cited by examiner

*Primary Examiner* — Paul Yen
*Assistant Examiner* — Eric Chang
(74) *Attorney, Agent, or Firm* — Meyertons, Hood, Kivlin, Kowert & Goetzel, P.C.

(57) ABSTRACT

In an embodiment, an apparatus includes an input circuit coupled to a first power supply with a first voltage level, a power circuit coupled to a second power supply with a second voltage level, and an output driver. The input circuit may receive an input signal, and generate an inverted signal dependent upon the input signal. The power circuit may generate a power signal in response to first values of the input and the inverted signals, wherein a voltage level of the power signal may be dependent upon the second voltage level. The power circuit may also generate a third voltage level on the power signal in response to second values of the input and the inverted signals. The output driver may generate an output signal dependent upon the input signal. The output signal may transition between the voltage level of the power signal and the ground reference level.

20 Claims, 5 Drawing Sheets

Circuits in Voltage Domain 112b

Circuits in Voltage Domain 114b

WIDE VOLTAGE RANGE LEVEL SHIFTING CIRCUIT WITH ISOLATION FUNCTION

BACKGROUND

Technical Field

Embodiments described herein are related to the field of integrated circuit implementation, and more particularly to level shifting circuits.

Description of the Related Art

Integrated circuits (ICs), such as, for example, systems-on-chip (SoCs), may include more than one power supply for supplying power to various circuits in a given SoC. Some power supplies may output a power signal at a different voltage level from other power supplies. In some SoCs, one or more voltage regulators may be used to generate power signals of varying voltage levels from a given power supply. These various power signals may be used by different circuits in an SoC, each power signal supplying power in what may be referred to as a respective "power domain" or "voltage domain." Circuits being powered by a common power signal may be considered to be in a same power domain. In an example SoC, a processing core may be in a first power domain and a memory may be in a second power domain. Data and control signals used between the core and the memory may need to be shifted from the first power domain to the second power domain, and vice versa, through the use of level shifting circuits.

SUMMARY OF THE EMBODIMENTS

Various embodiments of a processor are disclosed. Broadly speaking, a system, an apparatus, and a method are contemplated in which the apparatus includes an input circuit coupled to a first power supply with a first voltage level, a power circuit coupled to a second power supply with a second voltage level, and an output driver. The input circuit may be configured to receive an input signal, and to generate an inverted signal dependent upon the input signal. The input signal may transition between the first voltage level and a ground reference level. The power circuit may be configured to generate a power signal in response to a first set of values of the input signal and the inverted signal, wherein a voltage level of the power signal is dependent upon the second voltage level. The power circuit may also generate a third voltage level on the power signal in response to a second set of values of the input signal and the inverted signal, wherein the third voltage level is less than the second voltage level. The output driver may be configured to generate an output signal dependent upon the input signal. The output signal may transition between the voltage level of the power signal and the ground reference level.

In a further embodiment, the power circuit may be further configured to enter a reduced leakage mode by isolating itself from a ground signal in response to a de-assertion of an enable signal. In an embodiment, a pull-up device may be coupled to the output signal and to the second power supply. The pull-up device may be configured to couple the output signal to the second power supply in response to the de-assertion of the enable signal.

In another embodiment, the first voltage level may be greater than the second voltage level. In one embodiment, the first voltage level may be less than the second voltage level.

In a further embodiment, the input circuit may include an inverting circuit configured to receive the input signal as an input to the inverting circuit, and to generate the inverted signal as an output of the inverting circuit. In another embodiment, the inverting circuit may include ultra-low voltage threshold (ULVT) Metal-oxide Semiconductor Field-effect Transistors (MOSFETs).

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

Systems-on-chip (SoCs) may include multiple circuits operating at different power supply level. A voltage level of each power signal may be different from the other power supplies. As referred to herein, a "power domain" or a "voltage domain" refers to a group of circuits coupled to a common power signal. When a logic signal is transmitted from a first voltage domain into a second voltage domain, the signal may need to be level shifted to a voltage level that is compatible with the second voltage domain, and vice versa when transmitting a signal from the second voltage domain to the first. For example, a first circuit may be a 1.2V voltage domain, meaning logic signals transition between approximately 1.2V and 0V to indicate logic high and logic low levels, respectively. A second circuit may be in 0.8V voltage domain. A logic level from the 1.2V domain may be too high of a voltage level for the 0.8V domain, and could possibly damage circuits. Conversely, a logic high level from the 0.8V domain may be too low to be detected as a logic high in the 1.2V domain. In addition, voltage level mismatches between voltage domains may cause leakage or other performance issues due to transistors not being turned on completely by the mismatched voltage level. Level shifting circuits may be used transmit logic signals between voltage domains and mitigate these types of issues.

Embodiments of systems, devices, and methods for shifting voltage levels of a logic signal are disclosed herein. The disclosed embodiments demonstrate methods for shifting a voltage level of a logic signal travelling between two voltage domains. Moreover, these embodiments disclose level shifting circuits that may be capable of shifting voltage levels between voltage domains with wide differences between respective voltage levels.

Many terms commonly used in reference to SoC designs are used in this disclosure. For the sake of clarity, the intended definitions of some of these terms, unless stated otherwise, are as follows.

A Metal-Oxide Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the source and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel transistor on, i.e., opens a conductive path, and turns a p-channel MOSFET off, i.e., closes a conductive path. Conversely, a low level on the gate of a MOSFET turns a p-channel on and an n-channel off. In addition, the term transconductance is used in parts of the disclosure. While CMOS logic is used in the examples, it is noted that any suitable digital logic process may be used for the circuits described in this disclosure.

It is noted that "high," "high level," and "high logic level" refer to a voltage sufficiently large to turn on a n-channel MOSFET and turn off a p-channel MOSFET while "low," "low level," and "low logic level" refer to a voltage that is sufficiently small enough to do the opposite. As used herein, a "logic signal" refers to a signal that transitions between a high logic level and a low logic level. In various other embodiments, different technology may result in different voltage levels for "low" and "high."

The embodiments illustrated and described herein may employ CMOS circuits. In various other embodiments, however, other suitable technologies may be employed.

Figure 1:
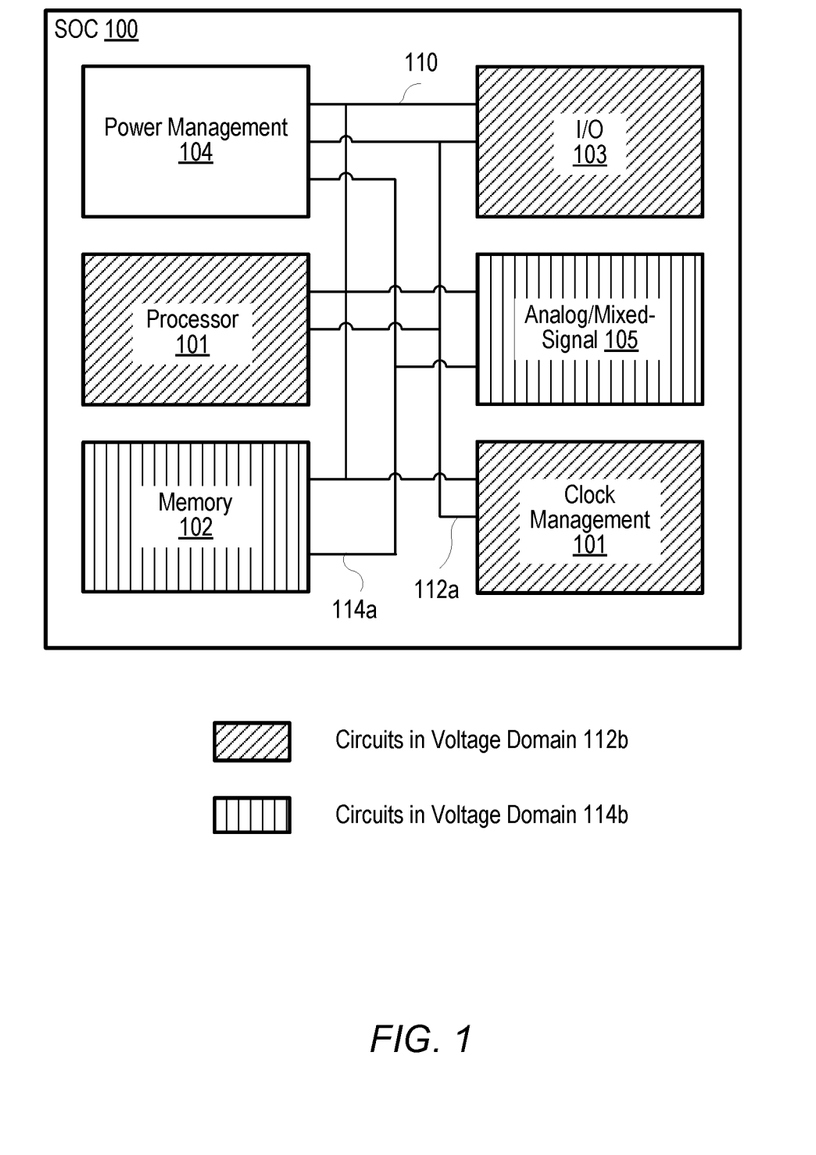
FIG. 1 depicts a block diagram of an embodiment of a system-on-a-chip (SoC).

A block diagram of an embodiment of an SoC is illustrated in FIG. 1. In the illustrated embodiment, SoC 100 includes processor 101 coupled to Memory Block 102, I/O block 103, Power Management Unit 104, Analog/Mixed-Signal Block 105, Clock Management Unit 106, all coupled through Bus 110. Additionally, Power Management Unit 104 may provide a Power Signal 112a to a first set of the circuit blocks in SoC 100 and Power Signal 114a to a second set of the circuit blocks. In various embodiments, SoC 100 may be configured for use in a mobile computing application such as, e.g., a tablet computer, smartphone or wearable device.

Processor 101 may, in various embodiments, be representative of a general-purpose processor that performs computational operations. For example, Processor 101 may be a central processing unit (CPU) such as a microprocessor, a microcontroller, an application-specific integrated circuit (ASIC), or a field-programmable gate array (FPGA). In some embodiments, Processor 101 may include multiple CPU cores and may include one or more register files and memories. In various embodiments, Processor 101 may implement any suitable instruction set architecture (ISA), such as, e.g., PowerPC™, ARM®, or x86 ISAs, or combination thereof.

Memory Block 102 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM). Some embodiments may include a single memory, such as Memory Block 102 and other embodiments may include more than two memory blocks (not shown). Memory Block 102, may, in some embodiments, include a memory controller for interfacing to memory external to SoC 100, such as, for example, one or more DRAM chips.

I/O Block 103 may be configured to coordinate data transfer between SOC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. I/O Block 103 may include general-purpose input/output pins (I/O pins). In some embodiments, I/O Block 103 may be configured to implement a version of Universal Serial Bus (USB) protocol, IEEE 1394 (Firewire) protocol, or Ethernet (IEEE 802.3) networking protocol.

Power Management Unit 104 may be configured to manage power delivery to some or all of the circuit blocks included in SoC 100. Power Management Unit 104 may include sub-blocks for managing multiple power supplies for various circuit blocks. In various embodiments, the power supplies may be located in Analog/Mixed-Signal Block 105, in Power Management Unit 104, in other blocks within SoC 100, or come from a source external to SoC 100 and coupled through power supply pins. Power Management Unit 104 may include one or more voltage regulators to adjust outputs of the power supplies to various voltage levels as required by circuit blocks in SoC 100, such as for reduced power modes, for example.

In the illustrated embodiment, Power Management Unit 104 supplies Power Signal 112a to Processor 101, I/O Block 103, and Clock Management Unit 106. These circuit blocks are in Voltage Domain 112b. Power Management Unit 104 supplies Power Signal 114a to Memory Block 102 and Analog/Mixed-Signal Block 105, putting these circuit blocks in Voltage Domain 114b. If a voltage level of Power Signal 112a is different than a voltage level of Power Signal 114a, then logic signals transmitted via System Bus 110 from a circuit block in the Power Signal 112a voltage domain may need to be level shifted before being received by a circuit block in the Power Signal 114a voltage domain.

Analog/Mixed-Signal Block 105 may include a variety of circuits including, for example, a crystal oscillator, an internal oscillator, a phase-locked loop (PLL), delay-locked loop (DLL), or frequency-locked loop (FLL). One or more analog-to-digital converters (ADCs) or digital-to-analog converters (DACs) may also be included in Analog/Mixed Signal Block 105. In some embodiments, Analog/Mixed-Signal Block 105 may also include radio frequency (RF) circuits that may be configured for operation with cellular telephone networks. Analog/Mixed-Signal Block 105 may include one or more voltage regulators to supply one or more voltages to various circuit blocks and circuits within those blocks.

Clock Management Unit 106 may be configured to enable, configure and monitor outputs of one or more clock sources. In various embodiments, the clock sources may be located in Analog/Mixed-Signal Block 105, within Clock Management Unit 106, in other blocks within SOC 100, or come from external to SoC 100, coupled via one or more I/O pins. Clock Management Unit 106 may include circuits for selecting an output frequency or reference clock of a PLL, FLL, DLL, or other type of closed-loop clock source.

System Bus 110 may be configured as one or more buses to couple Processor 101 to the other circuit blocks within the SOC 100 such as, e.g., Memory Block 102 and I/O Block 103. In some embodiments, System Bus 110 may include interfaces coupled to one or more of the circuit blocks that allow a particular circuit block to communicate through the bus. In some embodiments, System Bus 110 may allow movement of data and transactions (i.e., requests and responses) between circuit blocks without intervention from Processor 101. For example, data received through the I/O Block 103 may be stored directly to Memory Block 102.

It is noted that the SoC illustrated in FIG. 1 is merely an example. In other embodiments, different circuit blocks and different configurations of circuit blocks may be possible dependent upon the specific application for which the SOC is intended.

Figure 2:
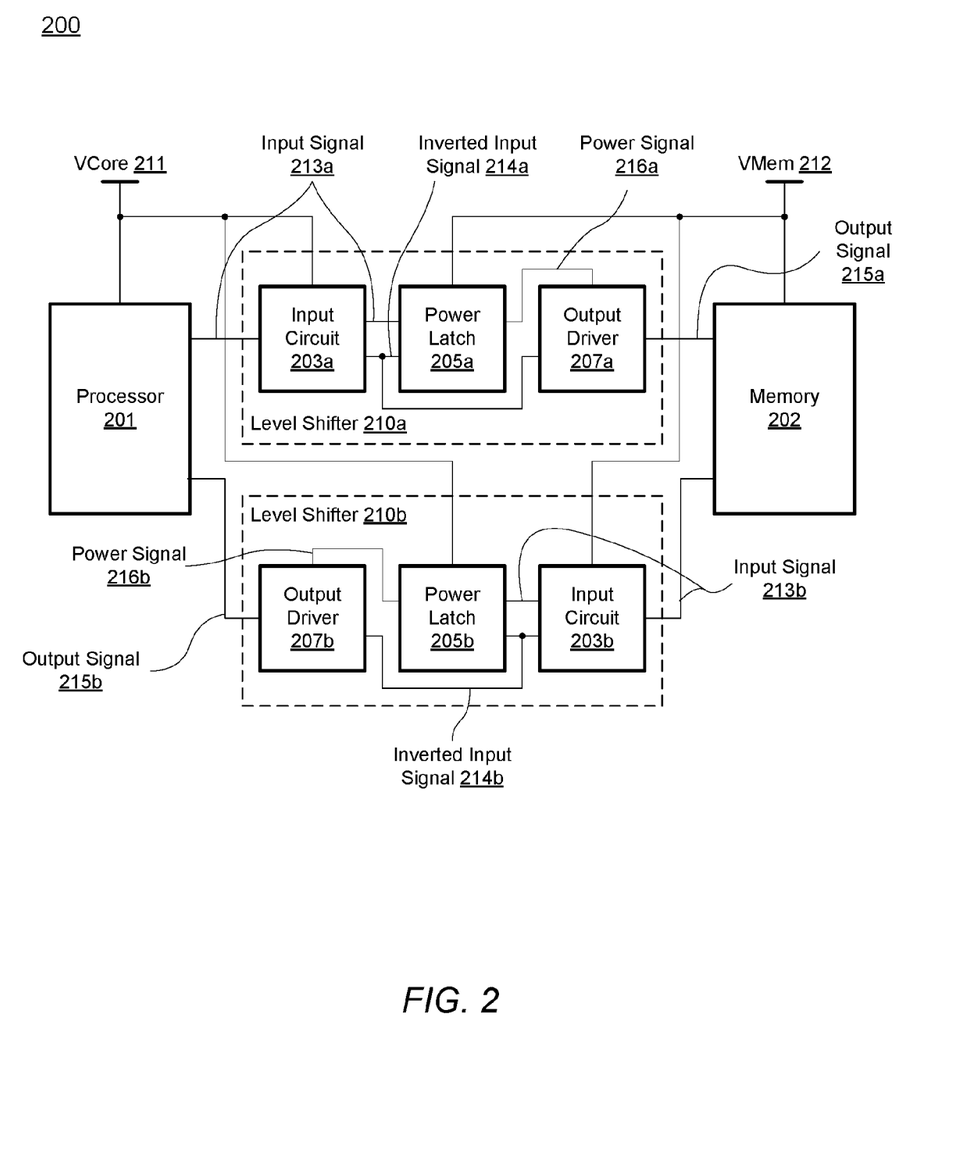
FIG. 2 illustrates a block diagram of an embodiment of a processor coupled to a memory via level shifting circuits.

Turning to FIG. 2, a block diagram of an embodiment of a processor coupled to a memory via level shifting circuits is illustrated. Processor 201 is coupled to Memory 202 via Level Shifters 210a and 210b. Each of Level Shifters 210a-b include a respective Input Circuit 203a-b, Power Latch 205a-b, and Output Driver 207a-b. Processor 201 receives power signal VCore 211 and Memory 202 receives power signal VMem 212. In some embodiments, Processor 201 may correspond to Processor 101 in FIG. 1 and Memory 202 may correspond to Memory 102. Level Shifter 210a receives Input Signal 213a and generates Output Signal 215a depending on internal signals Inverted Input signal 214a and Power Signal 216a. Likewise, Level Shifter 210b utilizes similar signals Input Signal 213b, Inverted Input Signal 214b, Power Signal 216B and generates Output Signal 215b.

In the illustrated embodiment, Processor 201 is in the VCore 211 voltage domain and Memory 202 is in the VMem 212 voltage domain. In the present embodiment, VMem 212 has a voltage level lower than VCore 211 and, therefore, Level Shifter 210a is used to shift logic signals from Processor 201 into the VMem 212 voltage domain and Level Shifter 210b is used to shift signals from Memory 202 into the VCore voltage domain.

When Processor 201 sends Input Signal 213a to Memory 202, Input Signal 213a is received by Input Circuit 203a, which is also in the VCore 211 voltage domain. Input Circuit 203a outputs two signals, the original Input Signal 213a and Inverted Input Signal 214a that is the inverse of the Input Signal 213a. Both of these signals remain in the VCore voltage domain. Power Latch 205a receives both Input Signal 213a and Inverted Input Signal 214a from Input Circuit 203a while Output Driver 207a receives Inverted Input Signal 214a.

In the current embodiment, Power Latch 205a compares the logic levels of Input Signal 213a and Inverted Input Signal 214a. Power Latch 205a is in the VMem 212 voltage domain. Since the signals received from Input Circuit 203a are in the higher voltage VCore 211 voltage domain, circuit elements coupled to these received signals may be designed to handle the higher voltage level without damage. The logic levels of Input Signal 213a and Inverted Input Signal 214a are compared. If Input Signal 213a is high and Inverted Input Signal 214a therefore low, then Power Latch 205a generates an Power Signal 216a with a voltage level approximately equal to the voltage level of VMem 212. Otherwise, if Inverted Input Signal 214a is high and Input Signal 213a low, then Power Latch 205a generates the Power Signal 216a with a lower voltage level, closer to a ground reference voltage. Power Signal 216a is used to provide power to Output Driver 207a.

Output Driver 207a receives Inverted Input Signal 214a as an input and receives Power Signal 216a as a power source. Similar to Power Latch 205a, Output Driver 207a includes circuit elements coupled to Inverted Input Signal 214a that are in the higher voltage VCore 211 voltage domain. These circuit elements may also be designed to handle the higher voltage level of Inverted Input Signal 214a without damage. If Inverted Input Signal 214a is high (i.e. input signal is low), then Power Signal 216a is at a low voltage level, and Output Driver 207a generates a logic low on Output Signal 215a, which corresponds to the logic low level of Input Signal 213a from Processor 201. Conversely, if Inverted Input Signal 214a is low (i.e. Input Signal 213a is high), then Power Signal 216a is approximately equal to VMem 212, and Output Driver 207a generates a logic high value on Output Signal 215a in the VMem 212 voltage domain.

When Memory 202 sends Input Signal 213b to Processor 201, a similar processor occurs through the elements of Level Shifter 210b. In this reverse case, Input Circuit 203b is in the VMem 212 voltage domain while Power Latch 205b is in the higher voltage VCore 211 voltage domain. The circuit elements of Power Latch 205b and Output Driver 207b that are coupled to Input Signal 213b and Inverted Input Signal 214b received from Input Circuit 203b may be designed to recognize logic high levels from the lower voltage VMem 212 voltage domain. Power Signal 216b from Power Latch 205b is approximately equal to VCore 211 when Input Signal 213b from Memory 202 is high, and, like Power Latch 205a, approaches the ground reference voltage when Input Signal 213b is low. Output Driver 207b generates Output Signal 215b in the VCore voltage domain corresponding to the logic state of Input Signal 213b from Memory 202.

It is noted that, to improve clarity and to aid in demonstrating the disclosed concepts, the diagram illustrated in FIG. 2 has been simplified. In other embodiments, different and/or additional circuit blocks and different configurations of the circuit blocks are possible and contemplated. The present embodiment uses a processor and a memory as circuit blocks communicating across two voltage domains. In other embodiments, however, any two circuit blocks may communicate across voltage domains. Additionally, although the voltage level of VCore 211 is greater than the voltage level of VMem 212 in the illustrated example, the opposite may be true in other embodiments.

Figure 3:
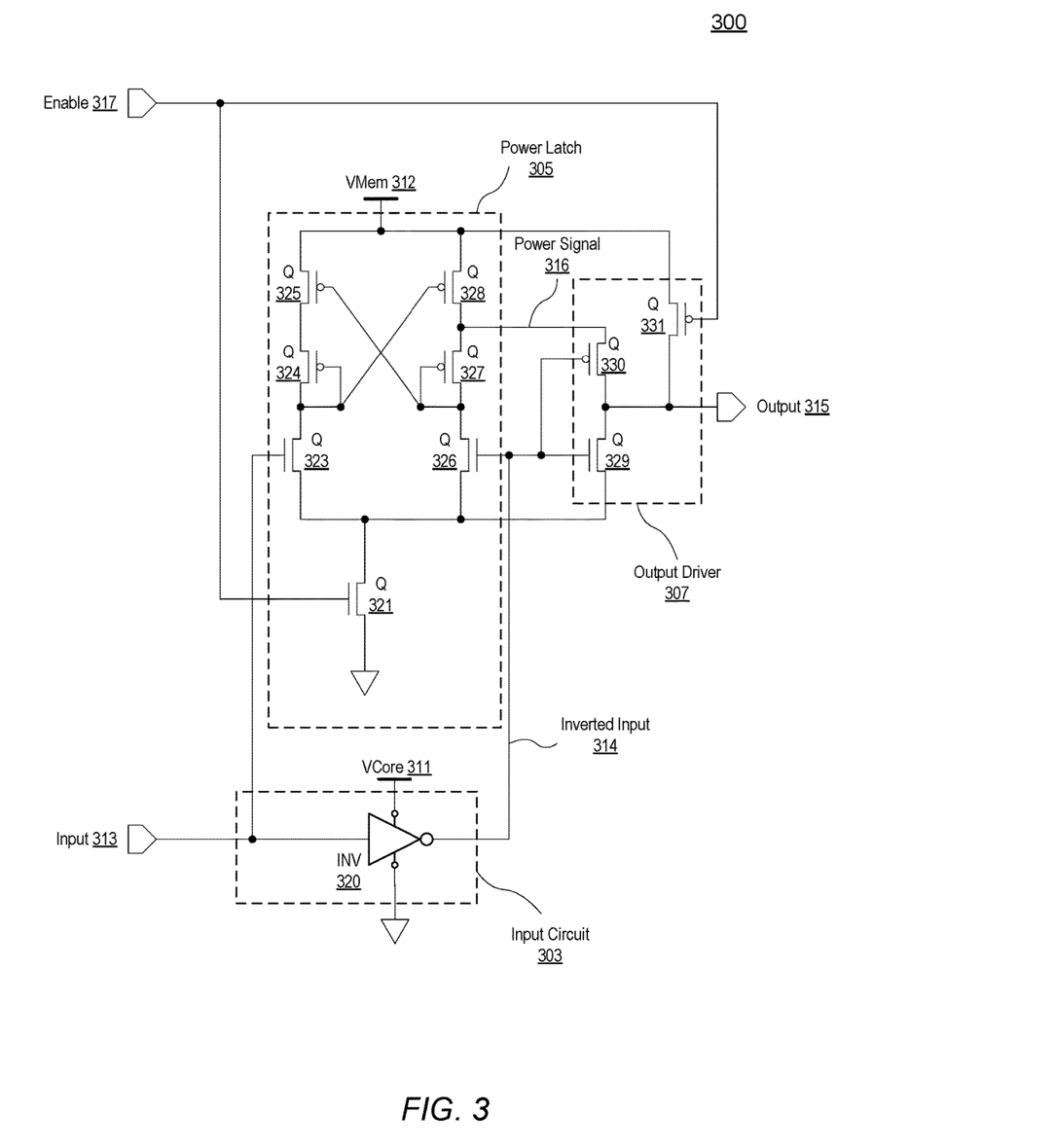
FIG. 3 shows a circuit diagram of an embodiment of a level shifting circuit.

Moving to FIG. 3, a circuit diagram of an embodiment circuit diagram of an embodiment of a level shifting circuit is shown. Level Shifting Circuit 300 may correspond to Level Shifter 210a or 210b in FIG. 2, and includes circuits for Input Circuit 303, Power Latch 305, and Output Driver 307. Input Circuit 303 includes inverting circuit (INV) 320, and receives power signal VCore 311. Power Latch 305 includes transistors Q 321, Q 323, Q 324, Q 325, Q 326, Q 327, and Q 328, and receives power signal VMem 312. Output Driver 307 includes transistors Q 329, Q330, and Q 331, and receives power from VMem 312 as well as from Power Signal 316 of Power Latch 305. Input Circuit 303 receives Input Signal (Input) 313 and generates Inverted Input Signal (Inverted Input) 314. Level Shifting Circuit 300 receives Enable Signal (Enable) 317 and generates Output Signal 315.

In the illustrated embodiment, Level Shifting Circuit 300 operates generally as described for Level Shifter 210a in FIG. 2. In addition to the description in FIG. 2, Enable Signal 317 is asserted to enable Level Shifting Circuit 300 when Input Signal 313 needs to be transmitted from the VCore 311 voltage domain to the VMem 312 voltage domain. If Input Signal 313 is inactive (for example, if Processor 201 drives Input Signal 313 and is idle), then Enable Signal 317 is de-asserted to pull output signal 315 into a known state. More specifically, Enable Signal 317 is driven to a logic low, causing Q 321 to be turned off, thereby isolating Power Latch 305 from the ground signal and reducing an amount of current that may leak through Power Latch 305 to the ground signal. In addition, the low value of Enable Signal 317 turns Q 331 on, pulling the voltage level of Output Signal 315 to VMem 312. Q 331, therefore, acts as a pull-up device to prevent the voltage level of Output Signal 315 from discharging down to the ground reference level, and providing a known idle state to circuits coupled to Output Signal 315. This process of pulling Output Signal 315 to a known (in the present embodiment, a logic high) state is referred to herein as "clamping" the output, or also as "logic fencing." In addition, as used herein, a "pull-up device" corresponds to a MOSFET or other suitable circuit element that couples a given signal to a power supply signal to prevent the given signal from discharging to a lower voltage level than a voltage level of the power supply signal.

When Enable Signal 317 is asserted, i.e., at a logic high value, Q 321 is turned on, coupling Power Latch 305 to the ground signal, and Q 331 is turned off, allowing Output Signal 315 to be driven by Q 329 and Q 330. While Level Shifting Circuit 300 is enabled, INV 320 receives Input Signal 313 and outputs Inverted Input Signal 314 to Q 326, Q 329, and Q330. Input Signal 313 also goes to Q 323. INV 320 may correspond to an inverting amplifier, although, in other embodiments, any suitable circuit that outputs an inverted value of an input signal may be used. In some embodiments, INV 320 may include ultra-low voltage threshold (ULVT) MOSFETs, allowing INV 320 to operate properly even when receiving very low input voltage levels.

If Input Signal 313 is low, then Q 323 is turned off and Inverted Input Signal 314 is high (with a voltage level approximately equal to the voltage level of VCore 311). The high level on Inverted Input Signal 314 turns Q 330 off and turns Q 326 and Q 329 on. With Q 326 on and Q 323 off, Q 324 and Q 328 are turned off and Q 325 and Q 327 are turned on. With Q 327 on, Power Signal 316 is pulled down towards the ground reference voltage.

It is noted that, in the illustrated embodiment, the gate terminals of Q 324 and Q 327 are coupled to the source terminals of Q 324 and Q 327, respectively. This coupling of the gate terminals to the source terminals may cause Q324 and Q 327 to operate similar to diodes, e.g., passing a current from the drain terminals to the source terminals when a voltage at the drain terminals is higher than a drain-to-gate threshold voltage of the transistors. As a result, a voltage drop may be observed between each of the drain and source terminals of Q 324 and Q 327. Accordingly, the voltage level applied to the drain terminal of Q 330 may be higher than the ground reference voltage, yet lower than VMem 312.

It is also noted that, although the present embodiment includes MOSFETs as circuit elements, other transistor technologies are known and contemplated. The MOSFET terminals identified herein as "gate terminal," "drain terminal," and "source terminal" may be substituted with corresponding terminals included in other transistor types by a person skilled in the art.

With Q329 on and Q 330 off, Output Signal 315 is discharged to the ground reference through Q 329 and Q 321. The lower voltage on the drain terminal of Q 330 may increase a speed of transition to the logic low on Output Signal 315, and may reduce potential leakage through Q 330.

Conversely, if Input Signal 313 is high (with a voltage level approximately equal to the voltage level of VCore 311) then Q 323 is turned on and Inverted Input Signal 314 is low. The low level on Inverted Input Signal 314 causes Q 326 and Q 329 to be turned off and Q 330 to be turned on. When Q 323 is turned on and Q 326 is turned off, Q 324 and Q 328 are turned on and Q 325 and Q 327 are turned off. As a result of Q 328 being turned on, a high signal (approximately equal to VMem 312) is transmitted to Q 330 via Power Signal 316. Since Q 330 is on due to the low level on Inverted Input Signal 314, the high level on Power Signal 316 is transmitted through Q 330 and onto Output Signal 315.

The diode structures create by Q 324 and Q 327 may result in Q 328 and Q 325, respectively, not requiring as low of a voltage level on their gate terminals to turn on, which may shorten a time to transition Power Signal 316 from high to low, and vice versa. This easier switching may result in Level Shifting Circuit 300 functioning properly even when a voltage difference between VCore 311 and VMem 312 is large. Additionally, driving the drain terminal of Q 330 with the output of Power Latch 305, rather than directly from VMem 312, may further improve the tolerance of Level Shifting Circuit 300 to large voltage differences between VCore 311 and VMem 312, particularly if VMem 312 is larger than VCore 311. As a result, Level Shifting Circuit 300 may provide level shifting capabilities across voltage domains with a wide range of respective voltage levels.

It is noted that Level Shifting Circuit 300 illustrated in FIG. 3 is merely an example. The circuit diagram includes sufficient elements for demonstrating the disclosed concepts. In other embodiments, additional circuit elements may be included. Furthermore, the placement of the circuit elements in FIG. 3 is not intended to imply an actual location of the elements in physical embodiments of the circuit.

Figure 4:
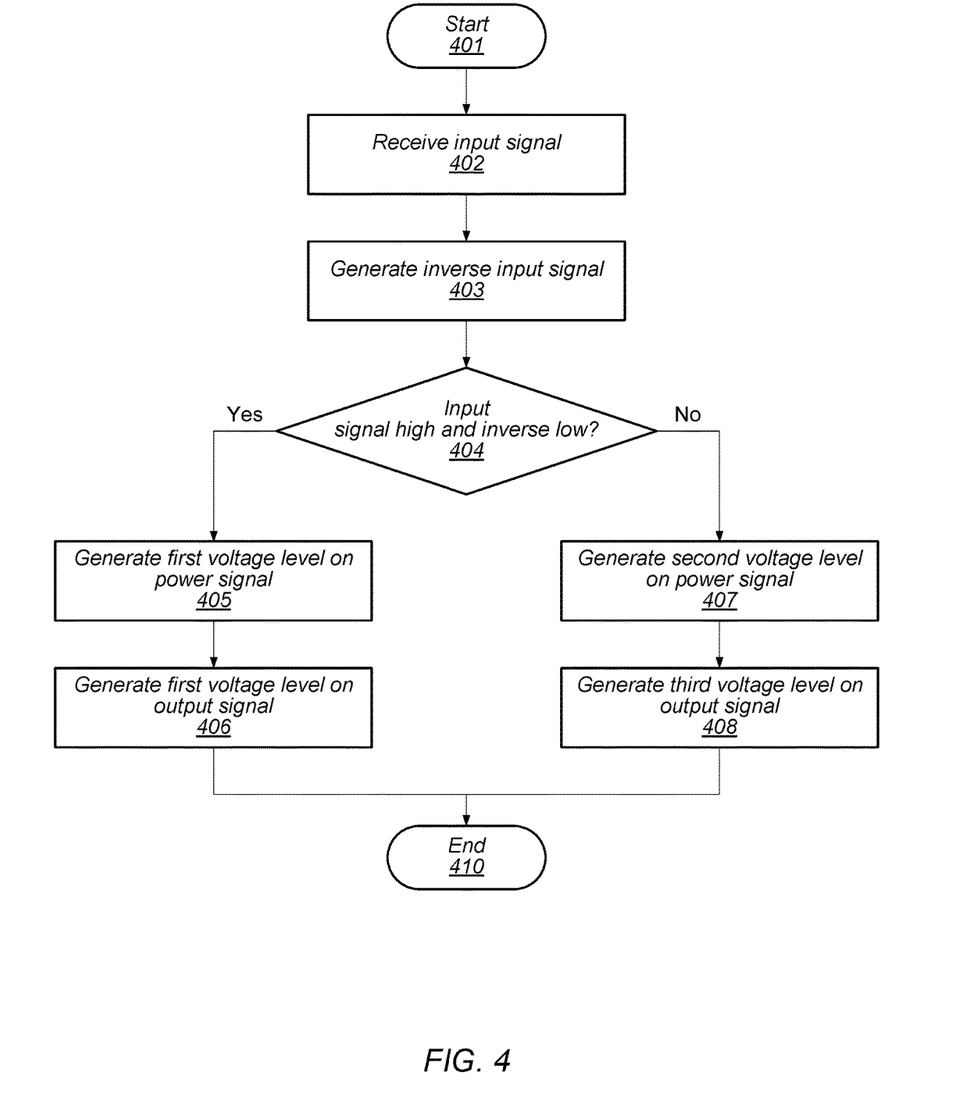
FIG. 4 shows a flow diagram of an embodiment of a method for operating a level shifting circuit.

Turning now to FIG. 4, a flow diagram of an embodiment of a method for operating a level shifting circuit, such as Level Shifting Circuit 300, is illustrated. Referring collectively to the diagram of FIG. 4 and Level Shifting Circuit 300, method 400 begins in block 401.

An input signal is received by Level Shifting Circuit 300 (block 402). In the present embodiment, Input Signal 313 is received by Level Shifting Circuit 300, and more specifically, by Input Circuit 303 and Power Latch 305. Input Signal 313 may be generated by a circuit block in an SoC, such as, for example, Processor 201 in FIG. 2. Input Signal 313 may, therefore, be in a voltage domain of VCore 311. A circuit block to receive Input Signal 313 is in a different voltage domain, such as, for example a VMem 312 voltage domain.

Input Circuit 303 generates a signal corresponding to the inverse of Input Signal 313 (block 403). In the illustrated embodiment, Input Circuit 303 includes an inverting circuit, INV 320, that receives Input Signal 313 and inverts the logic state of the signal such that when Input Signal 313 is high, the output of IVN 320 (i.e., Inverted Input Signal 314) is low, and vice versa. Inverted Input Signal 314 is provided to both Power Latch 305 and Output Driver 307.

Further operations of Method 400 may depend on the logic values of Input Signal 313 and Inverted Input Signal 314 (block 404). Power Latch 305 receives both Input Signal 313 and Inverted Input Signal 314 and compares the logic values of the two signals. If Input Signal 313 is high and Inverted Input Signal 314 is low, then the method moves to block 405 to generate a first voltage level. Otherwise, the method moves to block 407 to generate a second voltage level.

If Input Signal 313 is high and Inverted Input Signal 314 is low, then Power Latch 305 generates a first voltage level (block 405). When Input Signal 313 is high, Q 328 in Power Latch 305 is turned on and Q 327 is turned off due to the low level on the inverted input signal. Power from VMem 312 is passed through Q 328 and provided to Power Signal 316.

Output Driver 307 generates the first voltage level on Output Signal 315 (block 406). Output Driver 307 receives the first voltage level from Power Signal 316 on a drain terminal of Q 330. The low level on Inverted Input Signal 314 causes Q 330 to turn on and Q 329 to turn off, allowing the first voltage level from Power Signal 316 to pass through Q 330 and onto Output Signal 315. The first voltage level on Output Signal 315 is approximately equal to the voltage level of VMem 312, or in other words, a high logic level in the VMem 312 voltage domain is generated in response to the high logic level on Input Signal 313 in the VCore 311 voltage domain. It is noted that, dependent upon parameters of Q 328 and Q 330, as well as a current draw on Output Signal 315, some amount of voltage drop may occur between VMem 312 and Output Signal 315 such that a voltage level on Output Signal 315 may be slightly lower than the voltage level of VMem 312. Upon generating the high logic level on Output Signal 315, the method ends in block 410.

If, in block 404, Input Signal 313 is low and Inverted Input Signal 314 is, therefore, high, then Power Latch 305 generates a second voltage level (block 407). When Input Signal 313 is low, Q 328 in Power Latch 305 is turned off and Q 327 is turned on due to the high level on Inverted Input Signal 314. The drain terminal of Q 327 is coupled, via Q 326 and Q 321 to the ground reference. Q 327, however, is configured as a diode structure due to its gate terminal being coupled to its source terminal. This diode configuration of Q 327 may create a voltage drop from the drain terminal to the source terminal of Q 327 and, therefore, the second voltage level on Power Signal 316 may be higher than the ground reference voltage level.

Output Driver 307 generates a third voltage level on Output Signal 315 (block 406). Since Inverted Input Signal 314 is high, Q 330 is turned off and Q 329 is turned on. With the second voltage level from Power Signal 316 on the drain terminal and the high level on the gate terminal of Q 330, Q 330 is turned off and any potential leakage through Q 330 is minimized, allowing Q 329 to discharge Output Signal 315 towards the ground reference via Q 321. Accordingly, a low logic level is produced on Output Signal 315 in the VMem 312 voltage domain in response to the low logic level of Input Signal 313 in the VCore 311 voltage domain. (It is noted that a low level in the VCore 311 voltage domain may be at a same voltage level as a low level in the VMem 312 voltage domain). The method, upon generating the low level on Output Signal 315, ends in block 410.

It is noted that the method illustrated in FIG. 4 is an example for demonstration purposes. In some embodiments, additional operations may be included. Additionally, some or all operations may be performed in a different order in various embodiments.

Figure 5:
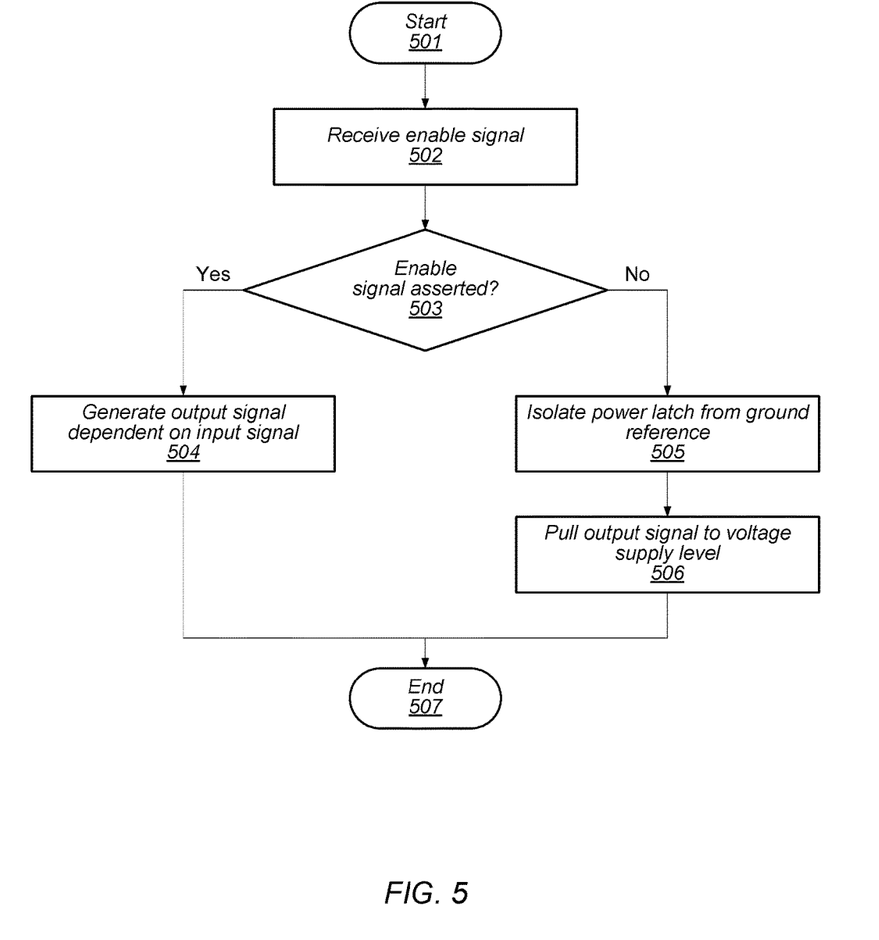
FIG. 5 illustrates a flow diagram of an embodiment of a method for clamping a level shifting circuit.

Moving now to FIG. 5, a flow diagram illustrating an embodiment of a method for isolating a level shifting circuit, such as Level Shifting Circuit 300, to reduce leakage current is shown. Referring collectively to Level Shifting Circuit 300 and the flow diagram of FIG. 5, the method begins in block 501.

An enable signal is received by Level Shifting Circuit 300 (block 502). In the illustrated embodiment, Level Shifting Circuit 300 receives an enable signal, such as, for example, Enable Signal 317. In various embodiments, Enable Signal 317 may be generated by a circuit block coupled to Input Signal 313, a circuit block coupled to Output Signal 315, or a power management unit that controls VCore 311 and/or VMem 312. For example, referring to FIG. 2, Enable Signal 317 may be generated by Processor 201 and asserted when Processor 201 has data to send to Memory 202. Conversely, Enable Signal 317 may be generated by Memory 202 and be de-asserted if Memory 202 enters a reduced power mode.

Further operations of the method may depend on a value of Enable Signal 317 (block 503). To place Level Shifting Circuit in an active state, Enable Signal 317 is asserted, i.e., driven to a logic high level. To reduce power when Level Shifting Circuit 300 is not in use, Enable Signal 317 is de-asserted, i.e., driven to a logic low level. IF Enable Signal 317 is high, then the method moves to block 504 to generate an output signal. Otherwise, the method moves to block 505 to isolate Power Latch 305 from a ground reference.

If Enable Signal 317 is high, then Level Shifting Circuit 300 generates an Output Signal 315 dependent upon a value of Input Signal 313 (block 504). While enabled, Level Shifting Circuit 300 transmits Input Signal 313 from the VCore 311 voltage domain into the VMem 312 voltage domain. In some embodiments, block 504 may correspond to Method 400 in FIG. 4. The method may end in block 507.

If Enable Signal 317 is low, then Level Shifting Circuit 300 isolates the power latch from the ground reference (block 505). Enable Signal 317 is coupled to the gate terminal of Q 321. When the gate terminal is low, Q 321 is turned off and Power Latch 305 is isolated from the ground reference. In some embodiments, Output Driver 307 may also be isolated from the ground reference.

A voltage level of Output Signal 315 is pulled to a given voltage level (block 506). In the present embodiment, Enable Signal 317 is coupled to the gate terminal of Q 331. The low level of Enable Signal 317 turns Q 331 on, allowing VMem 312 to be passed onto Output Signal 315. Q 331 may be designed as a pull-up device to pull a voltage level of Output Signal 315 towards a voltage level of VMem 312. Dependent upon parameters of Q 331 and a current load placed on Output Signal 315, the voltage level of Output Signal 315 may be at or near the voltage level of VMem 312. As a result, Output Signal 315 is clamped to VMem 312, and therefore, provides a known idle state to circuits coupled to Output Signal 315. The method ends in block 507.

It is noted that the method illustrated in FIG. 5 is merely an example. In other embodiments, additional operations may be included or some operations may be performed in a different order.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
an input circuit coupled to a first power supply with a first voltage level, wherein the input circuit is configured to:
receive an input signal, wherein the input signal transitions between the first voltage level and a ground reference level; and
generate an inverted signal that is based on the input signal;
a power circuit coupled to a second power supply with a second voltage level, wherein the power circuit is configured to:
generate a power signal in response to a first set of values of the input signal and the inverted signal, wherein a voltage level of the power signal is dependent upon the second voltage level; and
generate a third voltage level on the power signal in response to a second set of values of the input signal and the inverted signal, wherein the third voltage level is less than the second voltage level and greater than the ground reference level; and
an output driver configured to:
receive power from the power signal; and
generate an output signal that is based on a value of the inverted signal, wherein the output signal transitions between the voltage level of the power signal and the ground reference level.

2. The apparatus of claim 1, wherein the power circuit is further configured to enter a reduced leakage mode by isolating itself from a ground signal in response to a de-assertion of an enable signal.

3. The apparatus of claim 2, further comprising a pull-up device coupled to the output signal and to the second power supply, wherein the pull-up device is configured to couple the output signal to the second power supply in response to the de-assertion of the enable signal.

4. The apparatus of claim 1, wherein the first voltage level is greater than the second voltage level.

5. The apparatus of claim 1, wherein the output driver is further configured to generate the output signal with a low level value in response to receiving the third voltage level on the power signal.

6. The apparatus of claim 1, wherein the input circuit includes an inverting circuit configured to:
receive the input signal as an input to the inverting circuit; and
generate the inverted signal as an output of the inverting circuit;
wherein the inverting circuit includes ultra-low voltage threshold (ULVT) Metal-oxide Semiconductor Field-effect Transistors (MOSFETs).

7. The apparatus of claim 6, wherein the output driver is further configured to receive the power signal at a source terminal of a p-channel Metal-oxide Semiconductor Field-effect Transistor (MOSFET).

8. A method comprising:
receiving, by an input circuit coupled to a first power supply with a first voltage level, an input signal, wherein the input signal transitions between the first voltage level and a ground reference level;
generating, by the input circuit, an inverted signal that is based on the input signal;
generating, by a power circuit coupled to a second power supply with a second voltage level, a power signal in response to a first set of values of the input signal and the inverted signal, wherein a voltage level of the power signal is dependent upon the second voltage level;
generating, by the power circuit, a third voltage level on the power signal in response to a second set of values of the input signal and the inverted signal, wherein the third voltage level is less than the second voltage level and greater than the ground reference level;
receiving, by an output driver, power from the power signal; and
generating, by the output driver, an output signal that is based on a value of the inverted signal, wherein the output signal transitions between the voltage level of the power signal and the ground reference level.

9. The method of claim 8, further comprising isolating the power circuit from a ground signal in response to a de-assertion of an enable signal.

10. The method of claim 9, further comprising coupling, by a pull-up device, the output signal to the second power supply in response to the de-assertion of the enable signal.

11. The method of claim 8, wherein the first voltage level is greater than the second voltage level.

12. The method of claim 8, further comprising generating, by the output driver, the output signal with a low level value in response to receiving the third voltage level on the power signal.

13. The method of claim 8, further comprising receiving, by the output driver, the power signal at a source terminal of a p-channel Metal-oxide Semiconductor Field-effect Transistor (MOSFET).

14. A system, comprising:
a processor coupled to a first power supply with a first voltage level;
a memory coupled to a second power supply with a second voltage level; and a level shifting circuit coupled to the processor and to the memory, wherein the level shifting circuit is configured to:
- receive an input signal from the processor, wherein the input signal transitions between the first voltage level and a ground reference level;
- generate an inverted signal that is based on the input signal;
- generate a power signal in response to a first set of values of the input signal and the inverted signal, wherein a voltage level of the power signal is dependent upon the second voltage level;
- generate a third voltage level on the power signal in response to a second set of values of the input signal and the inverted signal, wherein the third voltage level is less than the second voltage level and greater than the ground reference level;
- utilize the power signal to provide power to an output driver included in the level shifting circuit; and
- generate an output signal that is based on a value of the inverted signal, wherein the output signal transitions between the voltage level of the power signal and the ground reference level.

15. The system of claim 14, wherein the level shifting circuit is further configured to enter a reduced leakage mode in response to a de-assertion of an enable signal.

16. The system of claim 15, wherein the level shifting circuit includes a pull-up device coupled to the output signal and to the second power supply, wherein the pull-up device is configured to couple the output signal to the second power supply in response to the de-assertion of the enable signal.

17. The system of claim 14, wherein the first voltage level is greater than the second voltage level.

18. The system of claim 14, wherein the output driver is further configured to generate the output signal with a low level value in response to receiving the third voltage level on the power signal.

19. The system of claim 14, wherein the level shifting circuit includes an inverting circuit configured to:
- receive the input signal as an input to the inverting circuit; and
- generate the inverted signal as an output of the inverting circuit;
- wherein the inverting circuit includes ultra-low voltage threshold (ULVT) Metal-oxide Semiconductor Field-effect Transistors (MOSFETs).

20. The system of claim 19, wherein the power is provided to the output driver at a source terminal of a p-channel Metal-oxide Semiconductor Field-effect Transistor (MOSFET).

* * * * *